(12) United States Patent
Roohparvar

(10) Patent No.: US 6,243,839 B1
(45) Date of Patent: *Jun. 5, 2001

(54) NON-VOLATILE MEMORY SYSTEM INCLUDING APPARATUS FOR TESTING MEMORY ELEMENTS BY WRITING AND VERIFYING DATA PATTERNS

(75) Inventor: Frankie F. Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/094,752

(22) Filed: Jun. 15, 1998

Related U.S. Application Data

(63) Continuation of application No. 08/589,754, filed on Jan. 22, 1996, now Pat. No. 5,825,782.

(51) Int. Cl.$^7$ .................................................. G11C 29/00
(52) U.S. Cl. ...................... 714/718; 365/185.29; 365/201
(58) Field of Search .................. 371/21.1, 21.2, 371/67.1; 365/201, 185.06, 185.12, 185.18, 185.24, 185.26, 185.29, 185.22, 189.03; 714/718, 719, 720; 711/103

(56) References Cited

U.S. PATENT DOCUMENTS

| | | | |
|---|---|---|---|
| 4,782,487 | * 11/1988 | Smelser | 371/21.1 |
| 4,872,168 | * 10/1989 | Aadsen et al. | 371/21.3 |
| 5,428,568 | * 6/1995 | Kobayashi et al. | 365/185.24 |
| 5,448,525 | * 9/1995 | Sturges | 365/201 |
| 5,469,443 | * 11/1995 | Saxena | 714/720 |
| 5,513,333 | * 4/1996 | Kynett et al. | 711/103 |
| 5,530,675 | * 6/1996 | Hu | 365/185.24 |
| 5,537,357 | * 7/1996 | Merchant et al. | 365/218 |

\* cited by examiner

*Primary Examiner*—Emmanuel L. Moise
(74) *Attorney, Agent, or Firm*—Schwegman, Lundberg, Woessner & Kluth, P.A.

(57) ABSTRACT

A memory system which includes apparatus for efficiently performing parallel testing of the integrity of the memory cells contained in multiple memory devices. Each memory device or system is placed into a mode in which a desired test pattern is automatically written to each memory cell in each device. It is then verified that the data was written with the proper threshold voltage margin. The memory cells in each array are stepped through, address by address, and the data corresponding to the test pattern is written to each cell and then verified. After verification of the operation for a block of cells, a status bit is set to reflect successful completion of the test pattern write operation for the memory block.

20 Claims, 8 Drawing Sheets

NON-VOLATILE MEMORY SYSTEM INCLUDING APPARATUS FOR TESTING MEMORY ELEMENTS BY WRITING AND VERIFYING DATA PATTERNS

This application is a continuation of U.S. patent application Ser. No. 08/589,754, filed Jan. 22, 1996 now U.S. Pat. No. 5,825,782.

TECHNICAL FIELD

The present invention relates to non-volatile memory systems, and more specifically, to a memory system which includes apparatus for testing the memory cells of such systems by automatically writing a data pattern to each memory cell and verifying successful completion of the write operation.

BACKGROUND OF THE INVENTION

In early integrated circuit memory systems, the detailed operation of the memory system was controlled directly by a processor unit which utilized the memory. This was referred to as external control of the memory system operations because the control means was external to the memory itself. Since the operation of many memory systems requires a substantial amount of processor overhead, and since different manufacturers require different operations for optimizing their particular memories, many such systems now include an internal state machine (ISM) for controlling the operation of the memory system. The internal state machine controls the execution of the primary operations of the memory system, including reading, programming and erasing of the memory cells. Each of these primary operations is comprised of a large number of sub-operations which are necessary to carry out the primary operations, with these sub-operations also being controlled by the state machine.

FIG. 1 is a functional block diagram of a conventional non-volatile memory system 1. The core of memory system 1 is an array 12 of memory cells. The individual cells in array 12 (not shown) are arranged in rows and columns, with there being, for example, a total of 256K eight bit words stored in array 12. The individual memory cells are accessed by using an eighteen bit address A0–A17, which is input by means of address pins 13. Nine of the eighteen address bits are used by X decoder 14 to select the row of array 12 in which a desired memory cell is located and the remaining nine bits are used by Y decoder 16 to select the column of array 12 in which the desired cell is located. Sense amplifiers 50 are used to read the data contained in a memory cell during a read operation or during a data verification step in which the state of a cell is determined after a programming, pre-programming, or erase operation. The sense amplifier circuitry can be combined with the data compare and verify circuits used to compare the state of a cell to a desired state or to the input data used in programming the cell.

Programming or erasing of the memory cells in array 12 is carried out by applying the appropriate voltages to the source, drain, and control gate of a cell for an appropriate time period. This causes electrons to tunnel or be injected from a channel region to a floating gate. The amount of charge residing on the floating gate determines the voltage required on the control gate in order to cause the device to conduct current between the source and drain regions. This is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

Memory system 1 contains internal state machine (ISM) 20 which controls the data processing operations and sub-operations performed on memory array 12. These include the steps necessary for carrying out programming, reading and erasing operations on the memory cells of array 12. In addition, internal state machine 20 controls operations such as reading or clearing status register 26, identifying memory system 1 in response to an identification command, and suspending an erase operation. State machine 20 functions to reduce the overhead required of an external processor (not depicted) typically used in conjunction with memory system 1.

For example, if memory cell array 12 is to be erased (typically, all or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 15 (DQ0–DQ7), typically called an Erase Setup command. This is followed by the issuance of a second eight bit command D0H (1101 0000), typically called an Erase Confirm command. Two separate commands are used to initiate the erase operation in order to minimize the possibility of inadvertently beginning an erase procedure.

The commands issued on I/O pins 15 are transferred to data input buffer 22 and then to command execution logic unit 24. Command execution logic unit 24 receives and interprets the commands used to instruct state machine 20 to initiate and control the steps required for erasing array 12 or carrying out another desired operation. If a programming operation is being executed, the data to be programmed into the memory cells is input using I/O pins 15, transferred to input buffer 22, and then placed in input data latch 30. The data in latch 30 is then made available to sense amplifier circuitry 50 for the cell programming and data verification operations. Once a desired operation sequence is completed, state machine 20 updates 8 bit status register 26. The contents of status register 26 is transferred to data output buffer 28, which makes the contents available on data I/O pins 15 of memory system 1. Status register 26 permits the external processor to monitor certain aspects of the status of state machine 20 during memory array write and erase operations. The external processor periodically polls data I/O pins 15 to read the contents of status register 26 in order to determine whether an erase sequence (or other operation) has been completed and whether the operation was successful.

Memory system 1 verifies the status of the memory cells after performing programming or erasing operations on the cells. Verification occurs by accessing each memory element and evaluating the margins (the voltage differential between the threshold voltage of the memory cells and ground level) that the element has after the operation. The system then decides whether the element needs to be reprogrammed or erased further to achieve a desired operational margin.

The memory array needs to be programmed first in a pre-programming cycle before it can be erased. This is to avoid over-erasing the bits in some memory elements to a negative threshold voltage, thereby rendering the memory inoperative. During this cycle of pre-programming, the memory system needs to check to see if the bits are programmed to a sufficient threshold voltage level. This is accomplished by a pre-programming verification cycle that uses a different evaluation procedure than a regular read operation would use. After successful completion of the pre-programming cycle, a high voltage erase operation is executed. After the erase operation is completed, some memory systems go through an operation to tighten the distribution (reduce the variance) of memory element threshold voltages. This makes the manufacturing process easier and more reproducible. After this procedure, the memory system may perform a re-verify operation to determine if the data in the memory array has remained undisturbed.

FIG. 2 is a state diagram showing the process flow (sub-operations) of a memory system of the type shown in FIG. 1 during the pre-programming, high voltage erase, and distribution adjustment cycles of a complete erase operation. The complete erase operation starts with a pre-program cycle 200. This sub-operation programs all the elements in the memory array to a logic zero value to make sure that the erase process starts from a known cell threshold voltage level. This part of the complete erase operation is used to reduce the possibility of over erasure of some of the memory elements during the later steps of the complete erase operation.

The pre-program cycle begins with an operation which increments the address of the memory cell which is to be pre-programmed 202. This is done because the pre-programming operation is executed on a cell by cell basis. This step is followed by a high voltage level set-up stage 204 which prepares the system for application of the high voltage levels (typically about 12 volts is applied to the gate of each memory cell and 5 volts to the drain) used for programming or erasing a cell. The high voltage level used for writing to (programming) the cell is then applied at stage 206.

The appropriate voltage levels for executing the data verification sequence (reading the data programmed in the cell and comparing it to a desired value) are applied to the appropriate circuitry at stage 208. This is followed by a program verification stage 210 which verifies that the programmed cell has a sufficient threshold voltage margin. This is typically accomplished by comparing the threshold voltage of the cell to a reference cell having a desired threshold voltage (corresponding to a logic value of zero). If the verification operation was not successful, steps 204, 206, 208, and 210 are repeated. Once the verification stage for a particular memory cell is successfully completed, it is followed by a program clean up stage 212.

Program clean up stage 212 conditions all internal nodes of the memory array to default values in order to prepare the memory system for the next operation. This concludes the pre-programming cycle for a given memory cell. The address of the cell to be operated on is then incremented at stage 202 and the process repeats itself until the last cell in a memory block to be erased is successfully pre-programmed. At this time, the incremented address will point to the first address location in the block, which is the first address for the next operation. When this occurs, all of the memory cells have been pre-programmed and control is passed to the high voltage erase cycle 220.

In the high voltage erase cycle, the memory system performs a block erase operation on all of the cells contained in a block of memory. The first stage in the cycle is a high voltage level set-up stage 222 which prepares the memory block for application of the high voltage pulse(es) used for erasing the cells. This is followed by a high voltage stage 224 in which a short duration, high voltage pulse is applied to erase all of the memory cells in the block of cells. This is followed by a set-up verify stage 226 which applies the appropriate voltage levels for the data verification stage to the corresponding circuits. The next stage is an erase verify stage 228 which verifies that the erase operation was successfully carried out on each cell in the block. This is accomplished by accessing the cells, address by address, and comparing the threshold voltage of the cell to a reference cell having a desired threshold voltage level (corresponding to a logic value of one).

If the erase operation was not successfully carried out (a cell was not erased to the threshold voltage margin corresponding to the desired logic value), control is passed back to the high voltage level set-up stage 222 and the high voltage cycle is carried out again to erase the entire block of cells. If the erase operation was successful for the cell under consideration, the address of the memory cell is incremented 230 and the next cell is tested for verification of the erase operation. Thus, if the maximum address of the cells in the block of memory has not been reached, erase verify stage 228 is carried out on the next memory cell in the block. If the maximum address for cells in the block has been reached (meaning that all the cells in the memory block have been successfully erased), control is passed to the distribution adjustment cycle 240.

The distribution adjustment sub-operation 240 is used to tighten the distribution (reduce the variance) of the threshold voltages of the erased memory elements. This is done by applying high voltages (i.e., 12 volts) to the gates of all the memory cells in the memory block, with the memory cell drains floating and the sources at ground potential.

The distribution adjustment cycle begins with a high voltage set-up stage 242, which is followed by a high voltage stage 244 in which the voltages used to perform the adjustment sub-operation are applied. This is followed by set-up verification 246 stage which applies the appropriate voltage levels to the corresponding circuits, and erase verification 248 stage which acts to insure that all of the erased cells are still in an erased state. If the erase verification procedure fails, a final erase 249 stage may be executed. In the final erase stage, a short erase pulse is applied to the cells in the block. After completion of the previous steps, the memory elements are checked to determine if they still contain the appropriate data. At this point the erase operation is completed.

A programming operation is carried out by following a set of steps similar to those followed in pre-program cycle 200 of FIG. 2. In particular, stages 204 through 212 of FIG. 2 describe the primary functions carried out in a regular programming operation. As a program operation is typically carried out on a specific memory cell, the increment address state 202 used in the pre-program cycle to facilitate pre-programming of every cell in the memory array is not accessed. Another difference between the programming and pre-programming operations is that in a programming operation, program verify state 210 is designed to read the data programmed into the cell and compare it to data obtained from input data latch 30, rather than to a logic value of zero, as in the pre-programming operation.

As is evident form the preceding description, the erase operation requires the use of a complex state machine. In order to reduce the time it takes to test a memory system and hence the cost of testing, it is desirable to test multiple memory systems in parallel. It is also desirable to identify faulty memory cells without having to exercise all of the features of the state machine. This aids in reducing the time it takes to test the memory system.

The integrity of the memory cells contained in an array is typically tested by programming each cell (writing data to the cells) using a prescribed test pattern and then verifying that the data was properly written. Several test patterns are used to fully check the integrity of the cells. These include, among others, a pattern of all zeros, all ones, a checkerboard pattern, and an inverse checkerboard pattern. The pattern consisting of all ones is automatically generated as a result of a regular complete erase operation. However, for the other patterns a test engineer typically issues the address of a byte to which the pattern is to be written, prescribes the test pattern data, checks the status of the memory cells to determine if the programming operation was successfully completed, and then issues the next address for the pattern writing operation. This continues until all of the memory cells in the array have been tested with the pattern. After that, another pattern may be used to further check the memory cells.

As noted, in order to reduce the cost of testing memory devices, multiple memory arrays are tested in parallel. This further slows the testing process because for each byte of the multiple arrays being tested, the test engineer has to wait for the slowest of all the devices being tested to complete the pattern writing and verification steps before the next set of bytes can be tested. After one test pattern has been successfully written to each byte of the multiple arrays, a new test pattern can be written to the memory cells in the arrays. As is apparent, manual control of this testing process by the test engineer is very time consuming, even when multiple arrays are tested in parallel.

What is desired is an apparatus for efficiently testing multiple memory devices in parallel by automatically writing each of a set of test pattern data to the memory cells in each array, and then verifying successful completion of the write operation.

SUMMARY OF THE INVENTION

The present invention is directed to a memory system which includes apparatus for efficiently performing parallel testing of the integrity of the memory cells contained in multiple memory devices. This is achieved by placing each memory device or system into a mode in which a desired test pattern is written to a memory cell in each device, followed by verifying that the data was written with the proper threshold voltage margin. The memory cells in each array are automatically stepped through, address by address, and the data corresponding to the test pattern is written to each cell and then verified. After verification of the test pattern writing operation for a block of cells, a status bit is set to reflect successful completion of the operation for each memory block. At this point a new test pattern can be specified by an internal controller or a test engineer, and the procedure repeated. This means of writing multiple test pattern data and verifying successful completion of the operation under the control of the memory system internal state machine reduces the overall time required to conduct testing of multiple memory devices in parallel.

Further objects and advantages of the present invention will become apparent from the following detailed description and accompanying drawings.

DETAILED DESCRIPTION OF A PREFERRED EMBODIMENT

The inventor of the present invention has recognized that one means of reducing the time it takes to conduct parallel testing of multiple memory systems is to have the memory systems automatically step through each memory cell in the respective memory arrays and write a specified data pattern to the cells. The write operation would then be verified prior to executing the operation on the next cell in each of the memory arrays. This method allows parallel testing of the integrity of the memory cells contained in multiple memory systems with minimal involvement by a test engineer.

This means of testing the elements of a memory array can be implemented by entering a test mode in which the memory system's internal state machine (ISM) is responsible for writing a prescribed test pattern to a memory, verifying the successful completion of the write operation, and then incrementing the cell address for the subsequent test pattern write operation. Upon entry to the test mode, the ISM should reset the address generator which produces the address of the memory cell to be operated on. This is followed by incrementing the cell address to the first memory cell address in a block of cells.

Next, the ISM will cause test pattern data obtained from a data latch to be written to the accessed memory cell. This is followed by performing a data verification operation on the memory cell in which the state of the cell is compared to the test pattern data contained in the data latch. If the verify operation indicates a successful pattern write, the cell address is incremented and the procedure is repeated. If the verify operation indicates an unsuccessful pattern write, the pattern write may be repeated until it is successful, or the maximum number of attempts is reached. If the maximum number of unsuccessful attempts is reached, a status register bit indicating an error is set. Upon successful completion of the pattern write operation for each cell in a memory block, a status register bit indicating completion of the pattern write mode is set. The setting of a bit in the status register indicating the success or failure of the pattern write operation permits a test engineer to monitor the outcome of the operation without having to check whether each memory cell individually passes or fails the procedure.

As noted, one method of performing the data pattern write operation of the present invention is to execute the process flow previously described as an independent operation. However, it is also possible to perform the pattern write operation by modifying the stages of the complete erase operation shown in FIG. 2.

Figure 2:
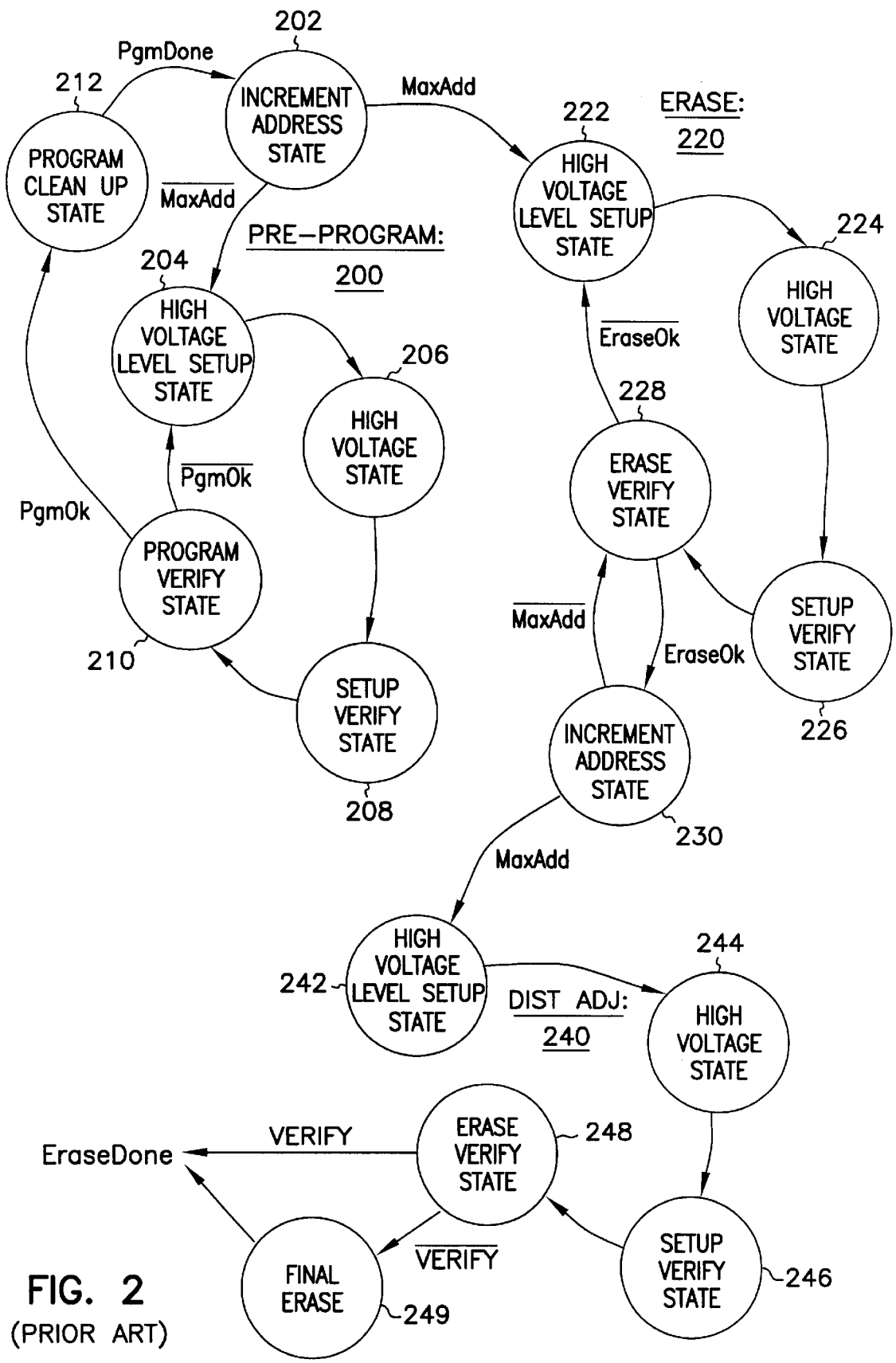
FIG. 2 is a state diagram showing the process flow (sub-operations) of a memory system of the type shown in FIG. 1 during the pre-programming, high voltage erase, and distribution adjustment cycles of a complete erase operation.

In a functional sense, pre-programming cycle 200 of the complete erase operation shown in FIG. 2 steps through each memory cell, writes data consisting of all zeros to the cell, and then verifies successful completion of the write operation. After verification, the address of the cell to be programmed is incremented and the process is repeated.

Figure 1:
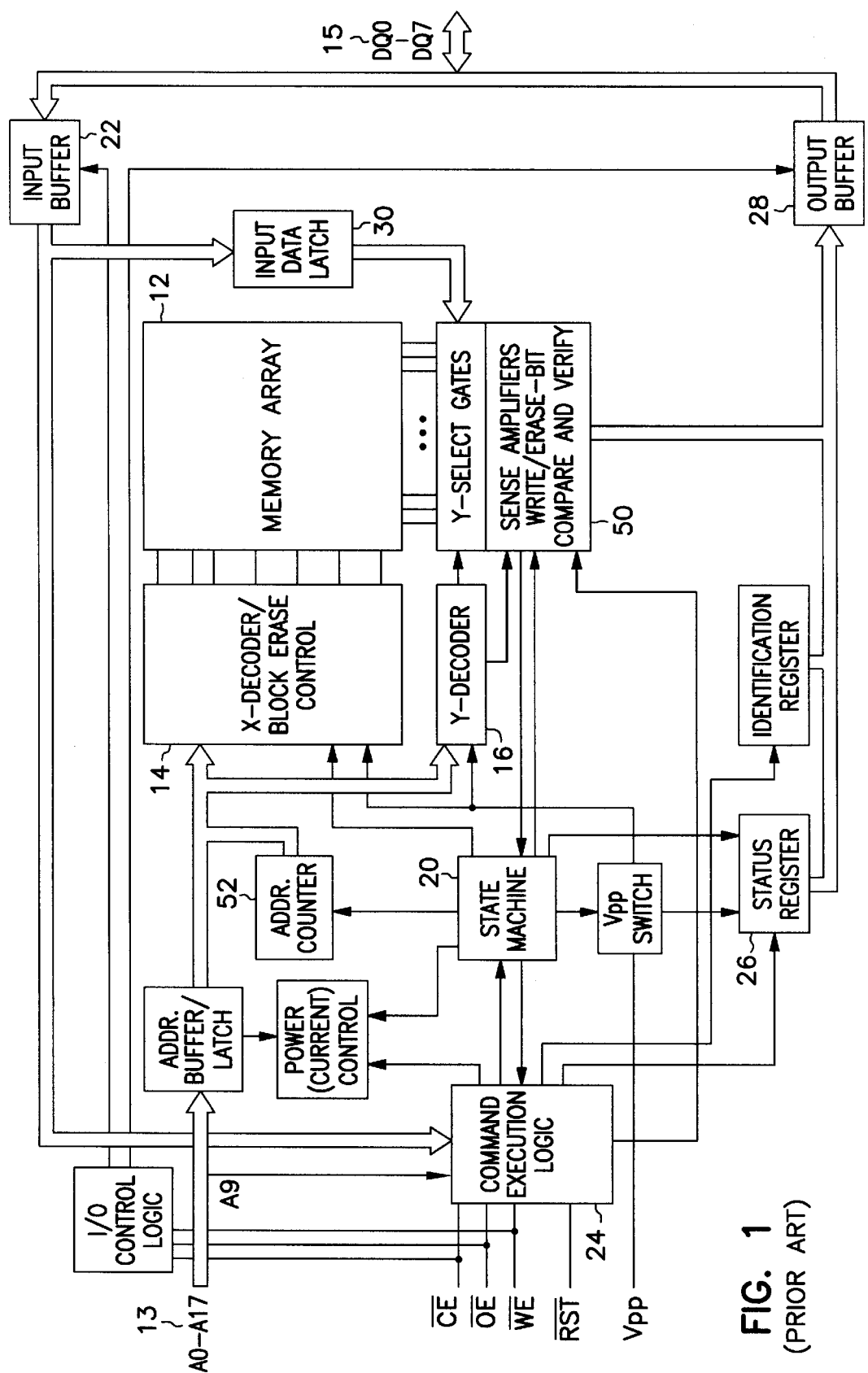
FIG. 1 is a functional block diagram of a conventional non-volatile memory system.

Thus, one method of automatically writing test pattern data to the memory cells contained in an array would be to enter the pre-programming cycle and execute that cycle for each memory cell. In this manner a pattern consisting of all zeros would automatically be written to the cells. If the data written during the pre-programming cycle were modified from being only zeros to other data patterns, then cycling through the pre-programming cycle for multiple memory systems would provide a method of writing specified test data to the memory cells. Test pattern data verification is included as part of the pre-programming cycle since it automatically occurs after writing the data to the memory cell (step 210 of FIG. 2). Furthermore, after successful completion of the pre-programming operation for a block of memory cells, status register 26 of FIG. 1 is updated. By checking the status register, a test engineer can monitor the results of testing a block of memory cells. Thus, using a modified pre-programming cycle is one possible means of testing the integrity of the memory cells.

However, the pre-programming cycle is one of three main cycles executed during a complete erase operation. Therefore, it is necessary not only to execute the pre-programming cycle with user supplied test pattern data, but also to disable or skip the other cycles of the complete erase operation. These two goals are accomplished by the memory system and apparatus of the present invention.

As discussed, an erase operation is normally initiated by entering commands 20H and DOH on I/O pins 15. Since the commands are entered on the I/O lines, they are treated as data and are latched into the data input latch of the device. Since the required data for the pre-programming cycle of an erase operation is known (all zeros), there is no need to include that data as a part of the command sequence, as would be necessary for a programming operation. If the command entered after 20H (Erase setup command) is not D0 (Erase Confirm command), then the memory system will typically set bits in the status register signifying the failure of the attempt and would discontinue the erase operation. As a result, the usual procedures for executing a pre-programming cycle cannot be used to perform the test pattern writing and verification. In addition, because a programming operation is typically performed on a single memory cell (so that the memory cell addresses are not automatically incremented), the test pattern operation cannot be efficiently performed on all of the memory cells in an array by using a programming command.

However, the test pattern writing and verification operation can be performed in an efficient manner by placing the memory system into a mode of operation in which the pre-programming cycle is carried out using data provided by a test engineer. This combines the address incrementing feature of the pre-programming cycle with the user provided data feature of a programming operation.

In accordance with the present invention, this combination of features is achieved by initiating a test mode of operation for the memory system, and then entering a specific code or sequence of codes which signify that an external pattern write operation is to be executed. This instructs the memory system to execute an erase operation (in particular the pre-programming cycle) in a different manner than it normally would.

After entering the test mode, the user enters the command 20H (Erase Setup) and follows that by inputting the erase data, which is the data that will be written to the array during the pre-programming cycle of the erase operation. In the pre-programming cycle of a normal erase operation, the data to be written to the array would be all zeros. However, in the test mode of operation, the data used during the pre-programming cycle is input through data I/O pins 15, transferred to data input buffer 22, and then provided to the data writing circuitry by means of input data latch 30.

Figure 3:
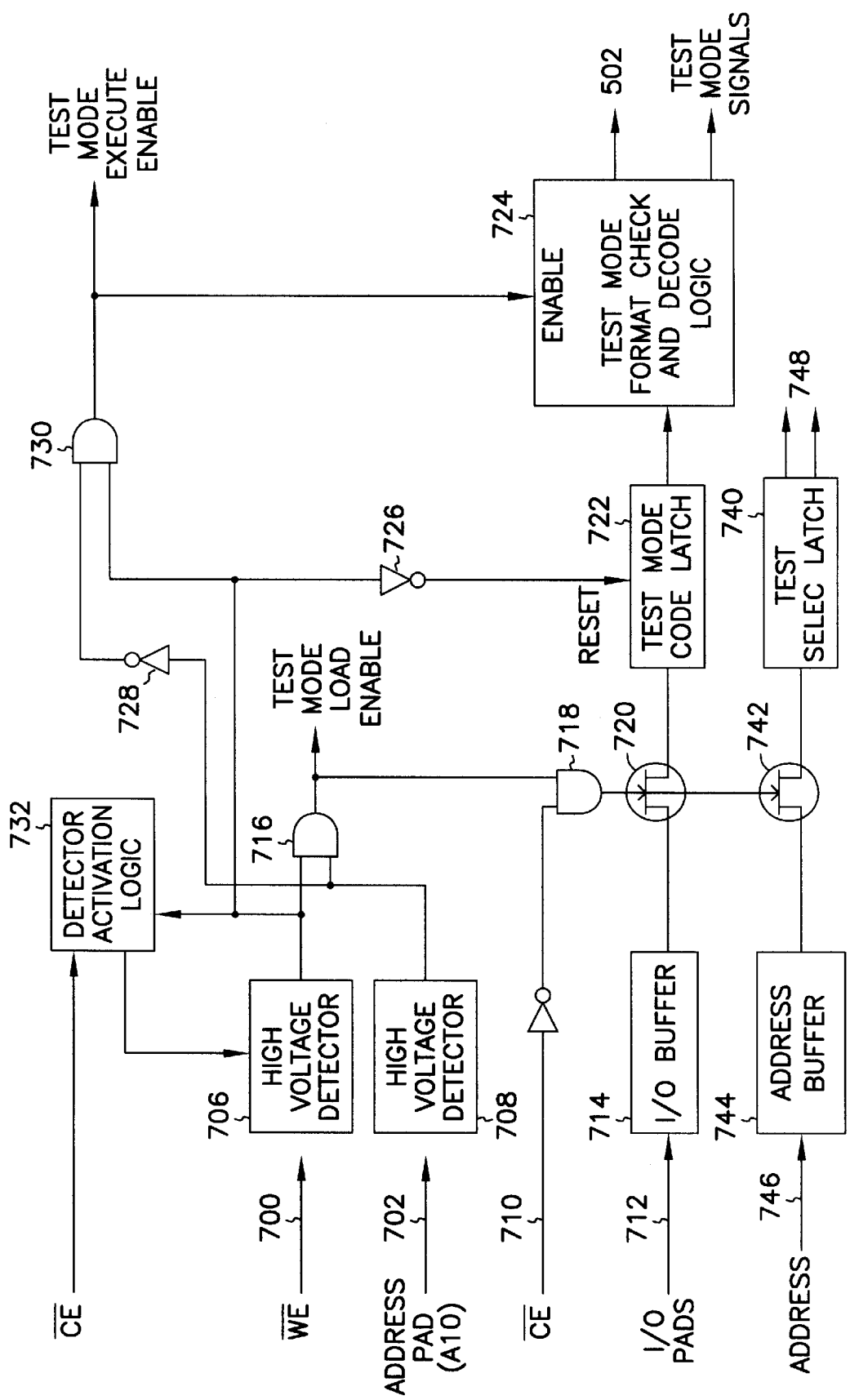
FIG. 3 is a schematic of a circuit for a detector/decoder which can be incorporated into a memory system and used for entering a test mode of operation in which code signals used to initiate a pre-programming cycle using test pattern data can be input.

One method for placing the memory system into a test or special mode of operation is described in U.S. patent application Ser. No. 08/386,704, now U.S. Pat. No. 5,526,361 entitled, "Apparatus for Entering and Executing Test Mode Operations for Memory", filed Feb. 10, 1995, the contents of which is hereby incorporated in full by reference. FIG. 3 is a schematic of a circuit for a detector/decoder (see element 102 of FIG. 4) which can be incorporated into a memory system and used for entering a test mode of operation in which code signals used to initiate a pre-programming cycle using specified test pattern data can be input.

Typically, the end user of a memory system would have no reason to cause the memory system to enter a test or special mode of operation since this mode is intended to be used by test engineers at the memory fabrication facility. Furthermore, accidental entry into such a mode is to be avoided since the memory could be rendered permanently inoperable in this mode. Thus, the test mode entry circuitry of FIG. 3 is designed to reduce the likelihood of accidental entry into the mode by requiring simultaneous application of high voltages to multiple memory system terminals.

The circuit of FIG. 3 is activated by application of a high voltage to two or more terminals 700 and 702 of the memory system from an external source. These terminals are non-dedicated terminals used during normal memory operations. Terminals 700 and 702 may include, for example, address terminal (pad) A10 and the write enable terminal $\overline{WE}$. The magnitude of the high voltage applied to terminals 700 and 702 is chosen to be outside of the range of voltages which would typically be applied to those terminals during use of the terminals in normal (non-test mode) operation of the memory system. This is done to prevent an end user from unintentionally entering the test or special mode. The high voltage applied to terminals 700 and 702 is detected by detectors 706 and 708. A detector circuit suited for use in constructing detectors 706 and 708 is described in U.S. patent application Ser. No. 08/493,162, now U.S. Pat. No. 5,723,990 entitled, "Integrated Circuit Having High Voltage Detection Circuit", filed Jun. 21, 1995, the contents of which is hereby incorporated in full by reference.

After application of the high voltage to terminals 700 and 702, a signal on another terminal, in this case the chip enable $\overline{CE}$ terminal 710, is made active (low). Code signal data corresponding to one of several possible test or special modes is placed on data I/O terminals 712 of the memory system and forwarded to I/O buffer 714. In the present case, code data corresponding to an external pattern write operation would be input. Note that data I/O terminals 712 and I/O buffer 714 of FIG. 3 correspond, respectively, to data I/O pins 15 and input buffer 22 of FIG. 1.

An AND gate 716 provides a test mode load enable signal when the outputs of high voltage detectors 706 and 708 indicate that an appropriate high voltage is being applied to terminals 700 and 702. The load enable signal is coupled to one input of an AND gate 718 together with an inverted signal $\overline{CE}$. This causes AND gate 718 to turn on pass transistor 720 which will forward the test or special mode code data entered by means of I/O pads 712 to buffer 714 and then to test mode code latch 722. Separate I/O terminals and pass transistors 720 are used for each bit of input test or special mode data so that the data will be loaded into latch 722 in parallel. Typically there are a total of eight bits of test code data so that latch 722 will contain eight bits. Signal $\overline{CE}$ is then brought back to a high state, thereby latching the code data in latch 722.

After latch 722 has been loaded with the code data, one of the high input voltages, such as the input to address A10 terminal 702 is removed so that the output of detector 708 will go low, thereby providing a high input to an AND gate 730 by way of inverter 728. Since the remaining input of gate 730 (the output of high voltage detector 706) will still be high, gate 730 will produce a test or special mode execute enable signal. Among other things, this will enable a Test Mode and Format Check and Decode Logic unit 724 which will verify that the data in latch 722 corresponds to a proper test or special mode. In addition, unit 724 will decode the mode code to determine which one of approximately fifteen different special or test modes has been designated. These modes each have an associated test mode signal which is produced by the Test Mode and Format Check and Decode Logic unit 724 and used by the memory system in combination with other signals for carrying out the various test or special mode functions.

The system will remain in the selected mode as long as the voltage applied to terminal 700 remains high. When signal $\overline{CE}$ is brought back to a high state, detector activation logic 732 keeps detector circuits 704 and 706 enabled as long as the voltage applied to terminal 700 remains high. During the course of carrying out the various test or special mode operations, it may be necessary to periodically change the state of the chip enable $\overline{CE}$ signal. However, since address A10 on line 702 has been shifted to a low state, the low output of AND gate 718 will prevent any change in the contents of mode code latch 722. Once the test or special mode of operation is completed, the high voltage applied to terminal 700 is removed, thereby causing the output of AND gate 730 to go low and end the test or special mode of operation.

The mode codes loaded into latch 722 are preferably of a specific format which reduces the possibility of accidental entry into a test mode. The mode code is typically divided into two groups of bits, with the first group of bits being format bits which signify a test or special mode of operation, and the remaining bits signifying a particular one of the modes. A description of a code format suited for use with the present invention can be found in the previously mentioned U.S. patent application Ser. No. 08/386,704, now U.S. Pat. No. 5,526,364, entitled, "Apparatus for Entering and Executing Test Mode Operations for Memory".

Thus, to carry out a test pattern write and verification operation the memory system is placed into a test mode of operation. Then the test mode codes corresponding to an external pattern write operation are entered using I/O pads 712. The next step is to instruct the memory system to disable or skip the cycles other than the pre-programming cycle which are normally executed during a complete erase operation. One method for performing this function is described in U.S. patent application Ser. No. 08/508,921, now U.S. Pat. No. 5,619,453 entitled "Memory System Having Programmable Flow Control Register", filed Jul. 28, 1995, the contents of which is hereby incorporated in full by reference.

Figure 4:
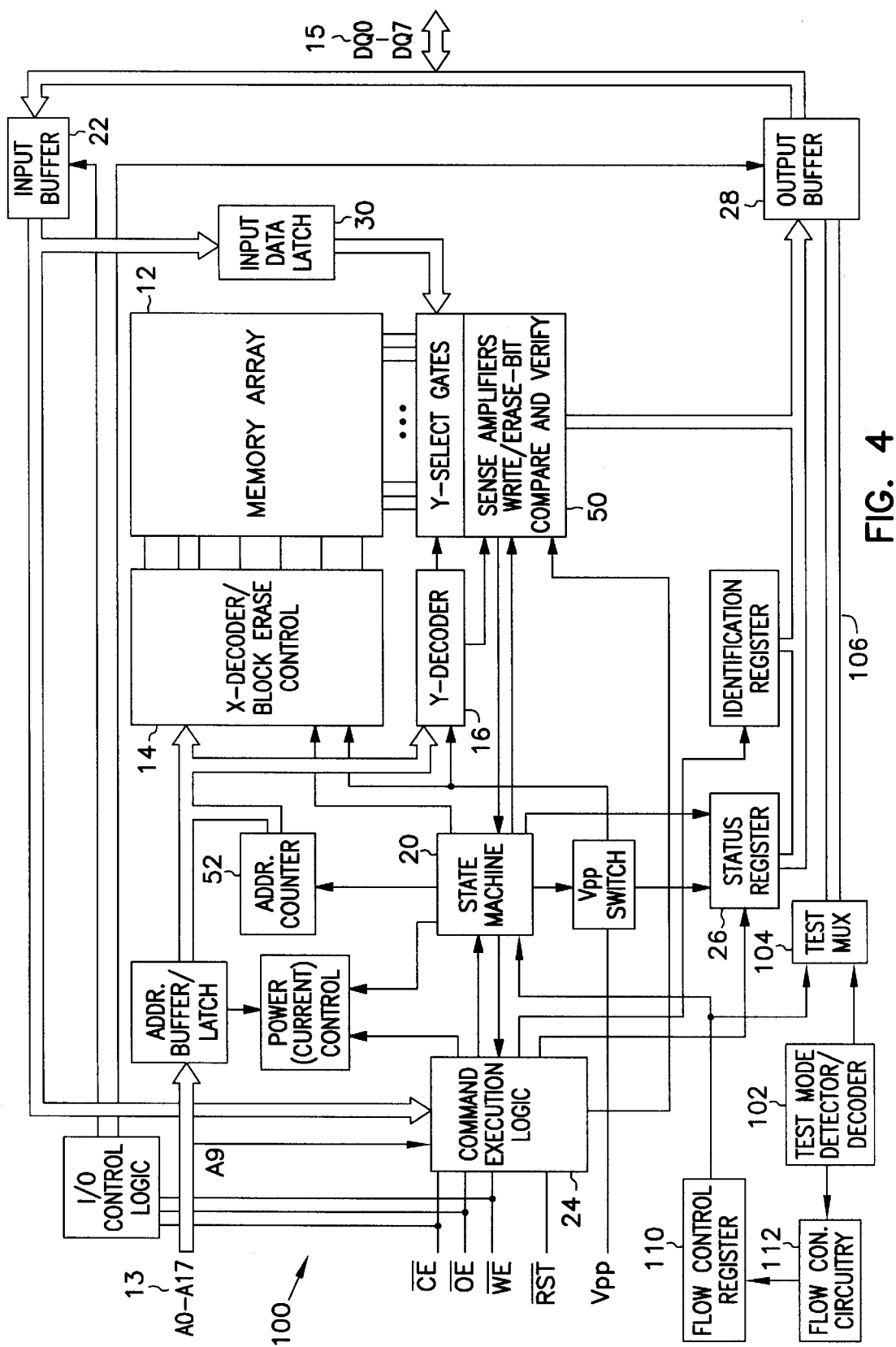
FIG. 4 is a functional block diagram of a memory system which includes a flow control register for altering the process flow of the operations and sub-operations carried out by the system's internal state machine.

FIG. 4 is a functional block diagram of a memory system 100 which includes a flow control register 110 for altering the process flow of the operations and sub-operations carried out by the system's internal state machine 20. It is noted that FIG. 4 is meant to be suggestive of the connections between flow control register 110, its associated circuitry 112 and the rest of the memory system, and that not all interconnections are shown. It is also noted that similar reference numbers in FIGS. 1 and 4 refer to the same signals and components in the two figures.

As with the memory system of FIG. 1, the core of memory system 100 is an array 12 of memory cells. The individual memory cells (not shown) are accessed by using an eighteen bit address A0–A17, which is input by means of address pins 13. Memory system 100 contains internal state machine (ISM) 20 which controls the data processing operations and sub-operations performed on memory system 100, such as the steps necessary for carrying out programming, reading and erasing operations on the memory cells of array 12. Internal state machine 20 is typically implemented in the form of a set of logic gates whose inputs determine which operations and sub-operations of the memory system are carried out, and in what order those operations occur.

Memory system commands are issued on I/O pins 15, transferred to data input buffer 22, and then to command execution logic unit 24. Command execution logic unit 24 receives and interprets the commands used to initiate and control the steps required for erasing array 12 or carrying out another desired operation. If a programming operation is being executed, the data to be programmed into the memory cells is input using I/O pins 15, transferred to input buffer 22, and then placed in input data latch 30. The data in latch 30 is then made available to sense amplifier circuitry 50 for the programming and data verification operations. Once an operation is completed, state machine 20 updates 8 bit status register 26. The contents of status register 26 is transferred to data output buffer 28, which makes the contents available on data I/O pins 15 of memory system 100.

Memory system 100 includes a test mode detector and decoder 102 used for entry into a test or special mode of operation in which the contents of flow control register 110 may be read or altered, and code signals used for executing an external pattern write operation may be input. Details of the implementation of the detector/decoder 102 were previously described with reference to FIG. 3.

Flow control register 110 contains data used to alter the process flow of the memory system. This is accomplished by instructing internal state machine 20 to include or bypass certain operations or sub-operations, examples of which are shown in FIG. 2. Individual bits within register 110 are used to determine the operations and sub-operations carried out under control of internal state machine 20. For example, by setting a bit or bits of the register, the flow may be modified to bypass the erase high voltage (step 222 of FIG. 2) or distribution tightening cycles (step 240 of FIG. 2) of the complete erase operation. If it is desired to read the contents of control register 110, that data may be routed through test signal switch 104 to output buffer 28 by means of data bus 106, and made available to a system designer.

Figure 5:
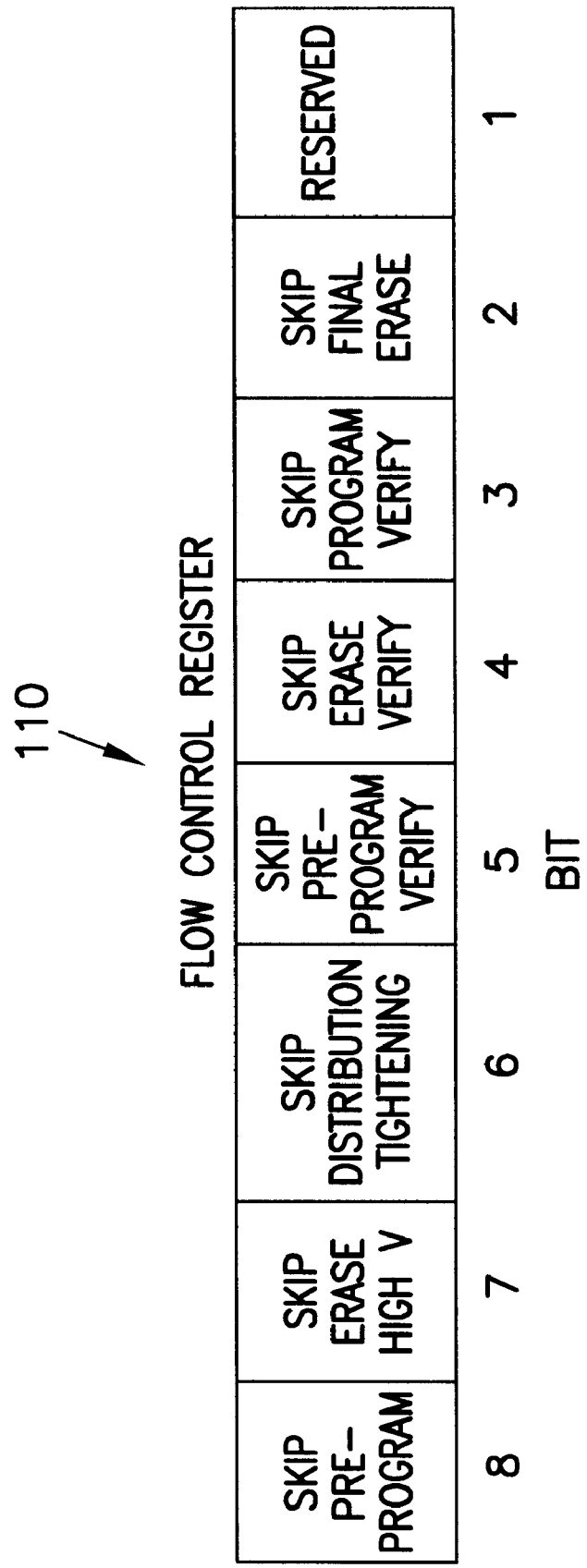
FIG. 5 is a diagram showing the contents of an embodiment of the flow control register of FIG. 4.

FIG. 5 is a diagram showing the contents of an embodiment of flow control register 110. As shown in FIG. 5, flow control register 110 is implemented as an 8 bit storage medium. Flow control register 110 may be implemented in the form of a volatile or a non-volatile storage medium, or a combination of the two. If implemented as a volatile medium, register 110 must be re-programmed each time the system is powered up. This can be accomplished by means of flow control register circuitry 112. Flow control register 110 may also be implemented in the form of a storage medium having a volatile and a non-volatile portion. In this case, register 110 would contain non-volatile memory elements which were programmed by circuitry 112 to values corresponding to the desired bit values of the flow control register. When power is applied to the memory system, the contents of the non-volatile portion of the flow control register would be copied to the volatile portion of the flow control register. This section would then control the operation of the state machine. Further details of a method of implementing flow control register 110 can be found in the previously mentioned U.S. patent application Ser. No. 08/508,921, now U.S. Pat. No. 5,619,423, entitled "Memory System Having Programmable Flow Control Register", and in U.S. patent application Ser. No. 08/508,864, now abandoned entitled, "Non-volatile Data Storage Unit and Method of Controlling Same", filed Jul. 28, 1995, the contents of which is hereby incorporated in full by reference.

The value of each bit of flow control register 110 corresponds to an instruction to internal state machine 20 to include or bypass the indicated operation or sub-operation, i.e., skip program verify, erase verify, etc. Depending on the value of the bits, the indicated cycle or stage in the process flow of the memory system is either implemented or bypassed. Combinations of bits (multiple bits) may also be used to instruct the internal state machine to include or bypass certain operations or sub-operations. It is noted that a memory system designer can place as many bits as necessary in register 110 to create as much flexibility in modifying the operation of the memory system as is desired. It is well known to those skilled in the art how to construct a logic circuit which uses the value of the indicated bit(s) of flow control register 110 to alter the operations and sub-operations carried out by an internal state machine.

After the contents of flow control register 110 has been set to skip those cycles of the complete erase operation other than the pre-programming cycle, the user enters the Erase Setup command (20H) and then inputs the erase (test pattern) data. As the memory system has been placed into the external pattern write mode of operation, the pre-programming cycle is executed using the test pattern data as the data for programming the memory cells and for verifying the contents of the memory cell during the data verification process.

The memory system then executes the pre-programming cycle. Each cell is accessed, the appropriate data (obtained from input data latch 30) is written to the cell, the write operation is verified, and if the operation was successful, the cell address is incremented. This continues until the desired test pattern data is written to the entire block of memory cells and each write operation has been verified. A status bit contained in status register 26 indicating successful completion of the external write operation is then set. By performing the steps of entering the external pattern write mode and executing the modified pre-programming cycle for multiple memory systems in parallel, a test engineer can efficiently test the integrity of large numbers of memory cells.

It is noted that the description given corresponds to a situation in which the same test pattern data (that contained in data latch 30) is written to each memory cell. The address of the first memory cell in the array is input by means of address pins 13. This address is automatically incremented by address counter 52 under the control of state machine 20 after each successful pre-programming operation.

The discussion so far has been directed to using one set of data, that contained in the input data latch, as the external test pattern. In order to make this mode of operation more versatile, a test select latch 740 (see FIG. 3) can be loaded with additional control data which determines the test pattern written to the memory cells. The control data takes the form of inputs 746 entered by means of address pins 13. The control data is stored in address buffer 744 and transferred to latch 740 under the control of pass transistor 742 at the same time that the test code is loaded into test mode code latch 722. The control data is made available from latch 740 in the form of first or second pattern control data 748, with pattern control data 748 typically having the same values as entered control data 746.

As discussed, control data 746 input to the memory system determines which of two pattern control codes 748 is latched into test select latch 740. Pattern codes 748 are provided as inputs to a pattern determiner module (element 308 of FIG. 6) which also has as inputs address data $X_0$ and $Y_0$. Data $X_0$ and $Y_0$ are provided by address counter 52 and are the least significant bits of row and column addresses of the memory cells in the array to which the test pattern will be written. The output of pattern determiner module 308 is a pattern invert signal 310 which is gated in an exclusive OR gate with the output of the input data latch. This determines the form of the data actually written to the memory cells when the pre-programming cycle is executed.

Figure 6:
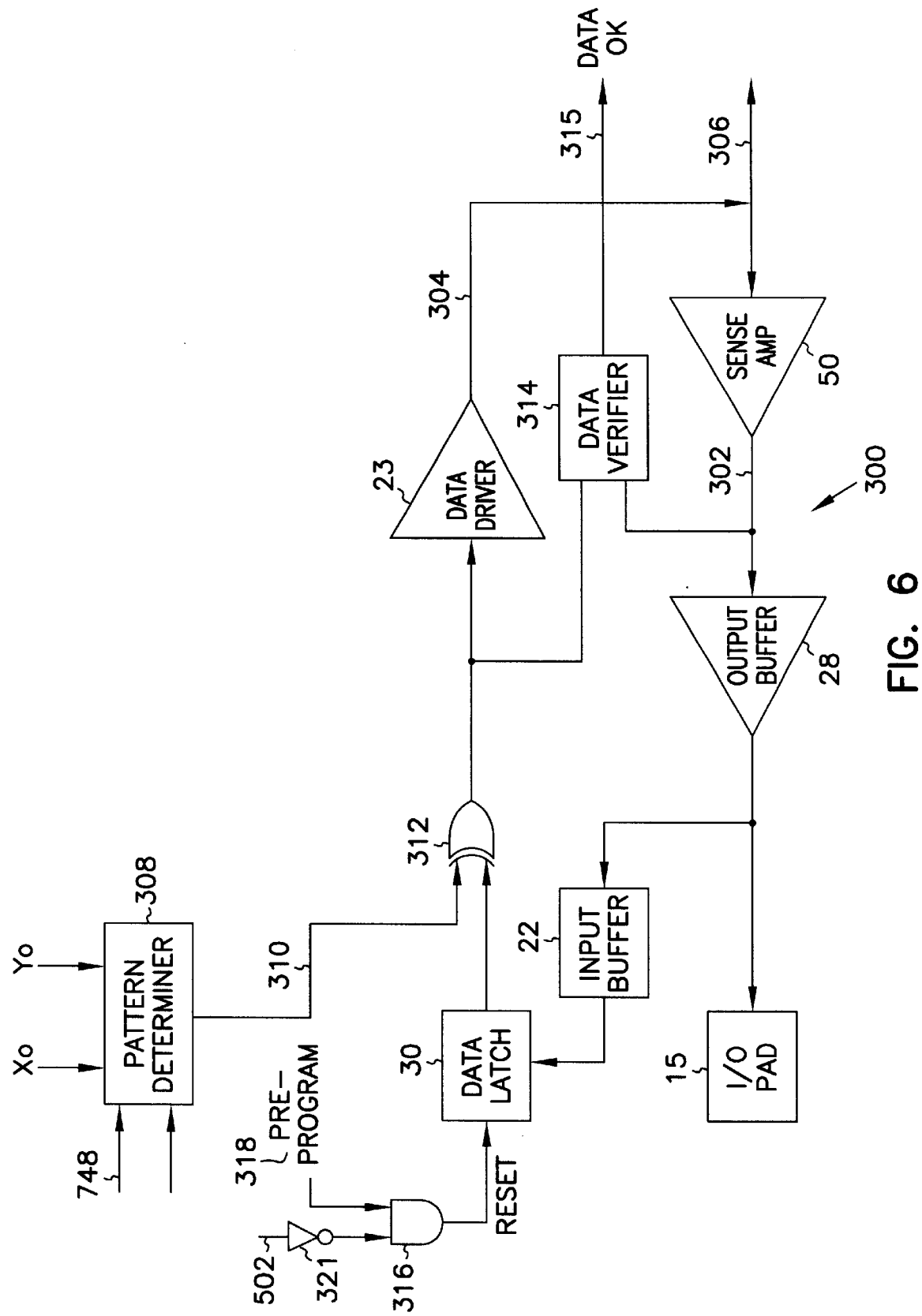
FIG. 6 is a block diagram of a data input/output circuit for use in writing test pattern data to the memory cells of a non-volatile memory array, and for reading data indicative of the state of those cells.

FIG. 6 is a block diagram of a data input/output circuit 300 for use in writing test pattern data to the memory cells of a non-volatile memory array, and for reading data indicative of the state of those cells. As shown in FIG. 6, an input/output pad 15 is connected to circuit elements which form a data read path 302 and a data write path 304 to a memory array (not shown). Pad 15 is part of the metallization of the integrated circuit containing the memory array and is connected by means of a wire bond to a data pin of the integrated circuit package. There is one data input/output circuit 300 associated with each data input/output line of the memory, with there typically being eight or sixteen data input/output lines depending upon the memory architecture.

Read path 302 and write path 304 are electrically connected to data line 306, which connects those paths to the memory array by means of a decoding multiplexer (not shown), such as Y decoder 16 of FIG. 4. The decoding multiplexer functions to connect read path 302 and write path 304 to a selected one of the plurality of bit lines of the array by means of data line 306. The selected bit line, which is determined by the address provided to the memory, is connected to the drain of the memory cell being read or programmed.

Write path 304 includes input data buffer 22 for performing a TTL level detection and signal buffering on data input by means of pad 15. The buffered data is then sent to data latch 30 which provides the data to data driver 23. Data driver 23 produces the voltage on line 306 which is applied to the bit line of the cell to be programmed. Data driver 23 is typically implemented in the form of a tri-statable driver having an output which can be placed in a high impedance mode and effectively disabled during a read operation.

As previously noted, the decoding multiplexer is used to access a desired memory cell in the array for purposes of reading data from or writing data to that cell. Thus, when it is desired to program a particular memory cell, the multiplexer is used to access the specified cell and input pad 15, buffer 22, latch 30, and data driver 23 are used as the data path to program that cell by means of data line 306.

When reading a memory cell of the array, the multiplexer is again used to access the bit line connected to the selected memory cell in the array. In the event the cell being read is in an erased state, the cell will typically conduct a current which is converted to a voltage on line 306. Sense amplifier 50 determines the state of the cell, i.e., whether it is programmed or erased (corresponding to a binary value of zero or one, respectively). This determination is based on comparing the voltage on line 306 to a reference voltage. The outcome of this comparison between the two input voltages is an output which is either high or low, corresponding to a digital value of one or zero. The output of sense amplifier 50 is sent to output buffer 28 which drives the data to output pad 15 where it is accessed by a user.

Verification of the data programmed into a memory cell is performed by data verifier module 314 in conjunction with the other components of read path 302 and write path 304. Data verifier module 314 typically contains logic for comparing the inputs to the module and producing an output signal indicative of the result of the compare operation. The inputs to data verifier 314 are the input data which is provided to data driver 23 and the output of sense amplifier 50. The output of data verifier 23 is a data OK signal 315 which signifies that the data programmed into a memory cell was successfully verified. During a verification stage which follows a test pattern writing operation, a memory cell is accessed and the data programmed (that provided to data driver 23) into the cell is compared to the output of the sense amplifier, which indicates the state of the cell. If the verification process is unsuccessful (data OK signal 315 is low), the programming operation is performed again. This sequence continues until a successful verification, or until the maximum number of programming attempts has been made.

In accordance with the present invention, data input/output circuit 300 also includes pattern determiner module 308. As discussed, the inputs to module 308 are pattern codes 748 and address data $X_0$ and $Y_0$. The output of module is pattern invert signal 310. The value of pattern invert signal 310 (high or low) depends upon the values of the four inputs to module 308. How the value of signal 310 is determined will be discussed later with reference to FIG. 7.

Pattern invert signal 310 is provided as an input to exclusive OR gate 312. A second input to gate 312 is the contents of data latch 30. The output of gate 312 serves as the input to input data driver 23 (and data verifier module 314), and thus determines the data programmed into a memory cell of the array. It is noted that if pattern invert signal 310 is low (corresponding to a logic value of zero), then exclusive OR gate 312 acts to pass the data contained in latch 30 for use in the programming or pre-programming cycle. If pattern invert signal 310 is high (corresponding to a logic value of one), then exclusive OR gate 312 acts to pass the inverse of the data contained in latch 30 for use in the programming or pre-programming cycle.

An input to data latch 30 is a reset signal which is the output of AND gate 316. The inputs to AND gate 316 are a pre-programming signal 318 and an inverted external test pattern mode signal 502 (produced upon entry into the test pattern mode, see FIG. 3), which is inverted by means of inverter 321. When pre-programming signal 318 is high and external test pattern mode signal 502 is low (indicating that the memory system is in the pre-programming mode of operation), gate 316 outputs a high reset signal. This forces latch 30 to have a contents consisting of all zeros. Thus, in this case the data written to the memory cells is all zeros. When pre-programming signal 318 is low and external test pattern mode signal 502 is high (indicating that the memory system is in the external test pattern mode of operation), gate 316 outputs a low reset signal. This does not reset latch 30 so that the data input by means of I/O pad 15 serves as the basis for the data written to the memory cells.

Figure 7:
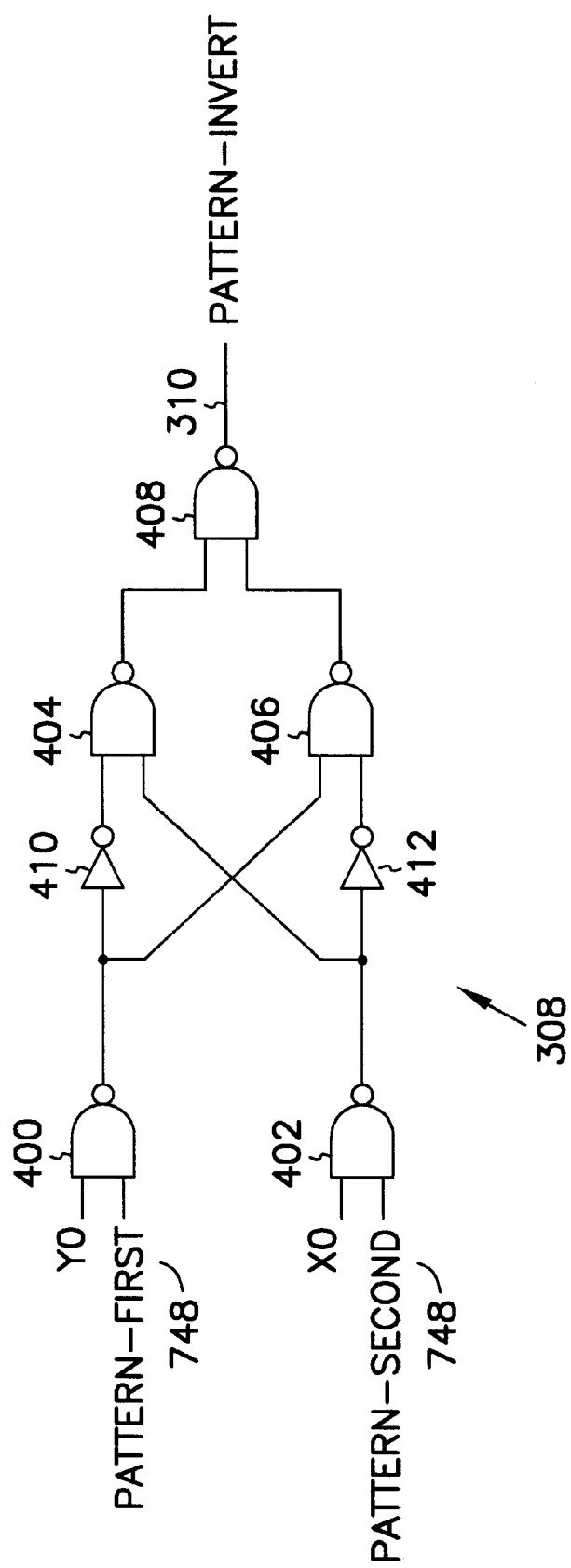
FIG. 7 is a schematic of a circuit for the pattern determiner module of FIG. 6.

FIG. 7 is a schematic of a circuit for pattern determiner module 308 of FIG. 6. As indicated in the figure, there are four inputs to module 308, first or second pattern control data 748, and address data $X_0$ and $Y_0$. Module 308 comprises NAND gates 400, 402, 404, 406, and 408, and inverters 410 and 412 connected as shown to produce output signal 310. The inputs to NAND gate 400 are first pattern control data 748 and address data $Y_0$, while the inputs to NAND gate 402 are second pattern control data 748 and address data $X_0$. The output of gate 400 is cross-coupled to serve as an input to gate 406 and inverted to serve as an input to gate 404. In a similar manner, the output of gate 402 is cross-coupled to serve as an input to gate 404 and inverted to serve as an input to gate 406. The outputs of gates 404 and 406 serve as the inputs for gate 408.

Pattern control data 748 typically takes the form of two bits or sets of data. If the value of both bits of pattern control data 748 is zero during execution of the external pattern write mode, then the entire array will be filled with the pattern data contained in input data latch 30. This is because with both bits of pattern control data 748 equal to zero, output 310 of pattern determiner module 308 is low. If the first bit of pattern control data 748 has a value of one and the second bit of pattern control data 748 has a value of zero, then the pattern data from latch 30 is inverted for odd values of the Y (column) addresses. This will result in columns having the same data while bytes next to each other will have the opposite data patterns. This is referred to as a column stripe pattern. If the first bit of pattern control data 748 has a value of zero and the second bit of pattern control data 748 has a value of one, then the pattern data from latch 30 is inverted for odd values of the X (row) addresses. This will cause the data to be the same in an entire row but different for adjacent rows. This is referred to as a row stripe pattern. If the values of both bits of pattern control data 748 are one, then the pattern data from latch 30 is inverted for both odd rows and columns. This produces a checkerboard pattern. The values of $X_0$ and $Y_0$ for a particular memory cell determine the even-ness or odd-ness of a row ($X_0$) or column ($Y_0$) in which that cell is located. They are used with pattern control data 748 to determine whether the pattern data in latch 30 or the inverse of that data is written to a particular cell in order to produce a desired pattern.

Verification of the pattern data programmed into a memory cell is again performed by data verifier module 314 of FIG. 6 in conjunction with the other components of read path 302 and write path 304. During a verification cycle which follows a test pattern writing operation, a memory cell is accessed and the data programmed (that provided to data driver 23) into the cell is compared to the output of the sense amplifier, which indicates the state of the cell. If the verification process is unsuccessful (data OK signal 315 is low), the programming operation is performed again. This sequence continues until a successful verification, or until the maximum number of programming attempts has been made.

In the embodiment of the present invention discussed, the user is responsible for entering the test mode and setting the contents of flow control register 110 to the appropriate values for skipping the high voltage erase and distribution tightening cycles of the complete erase operation. However, this function may also be executed automatically upon entry into the test mode and input of the Erase Setup Command and the Erase (pattern) Data. This is accomplished by having Test Mode and Format Check and Decode Logic unit 724 of detector/decoder 102 produce a flow register control signal (signal 502 of FIGS. 3, 6, and 8) when the external pattern write mode is entered. Flow register control signal 502 (or the inverted signal) serves as a first input to a set of logic gates, with the other input to each gate being the value of one of the bits of flow control register 110. The outputs of the logic gates serve as the control signals to the state machine to skip the desired cycles or stages of a complete erase operation.

Figure 8:
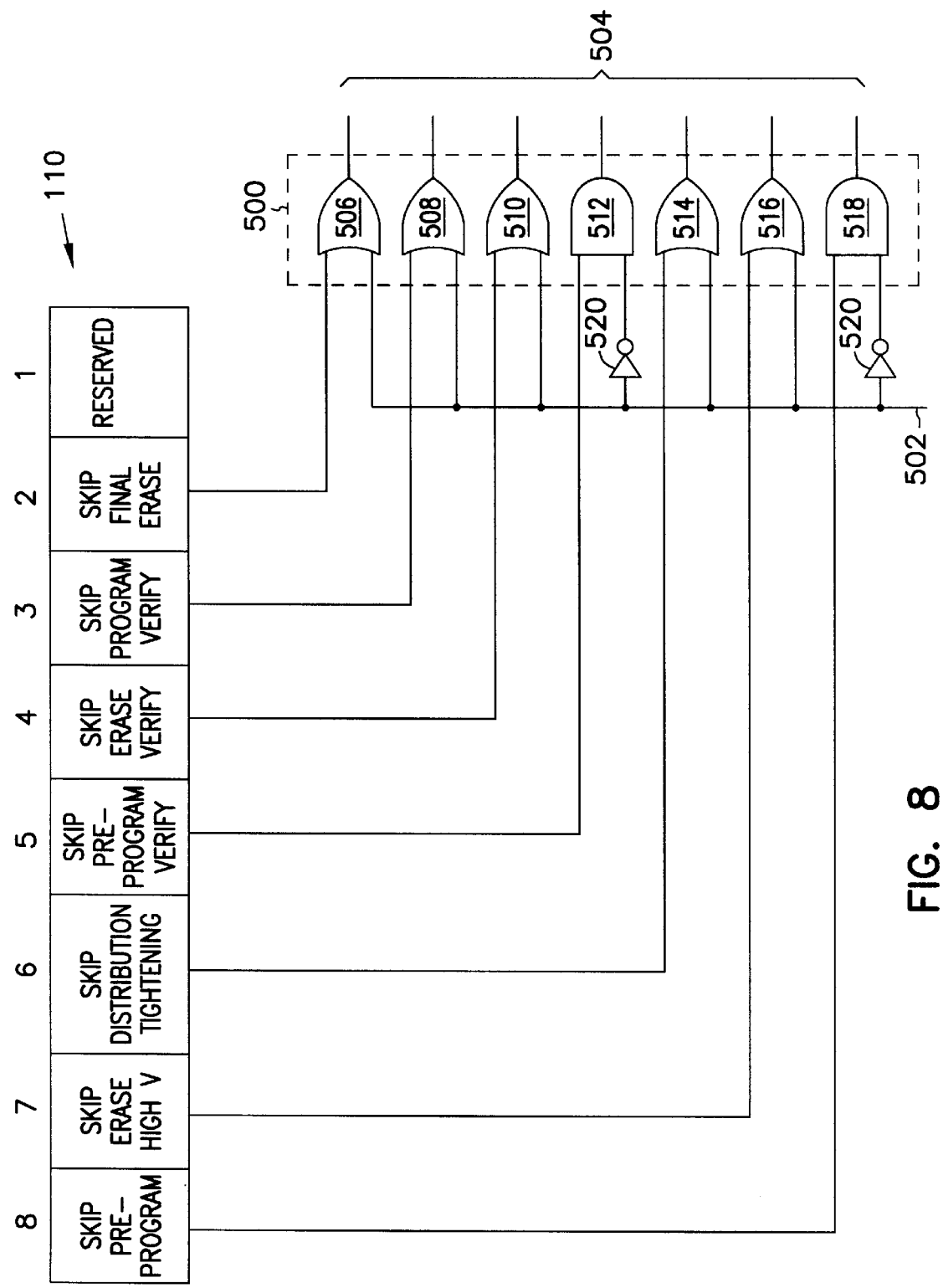
FIG. 8 shows a set of logic gates which can be used in conjunction with a flow control register control signal to automatically provide signals to cause a state machine to skip the desired stages or cycles of a complete erase operation.

FIG. 8 shows a set of logic gates 500 which can be used in conjunction with flow control register control signal 502 to automatically provide control signals 504 to cause state machine 20 to skip the desired cycles or stages of a complete erase operation. As shown in the figure, logic gates 500 comprise a set of two-input OR gates (gates 506, 508, 510, 514, and 516) and two-input AND gates 512 and 518. A first input to each logic gate 500 is a signal representing the contents of each bit of flow control register 110. Thus, one input to each logic gate 500 is a high (logic one) or low (logic zero) value corresponding to the value of each bit of register 110. The second input to each logic gate 500 is flow control register control signal 502 or an inverted version of that signal. The inverted version is provided by an inverter 520 placed in the signal path between signal 502 and the second input to the appropriate logic gate 500. The internal state machine logic is such that when a control signal 504 produced by a logic gate 500 is high, the cycle or stage corresponding to the input to that logic gate is skipped. For example, if output signal 504 of OR gate 508 is high, then the program verify stage is skipped. With flow control register control signal 502 high, the outputs of each of the OR gates will be high. As a result, the cycles or stages corresponding to the second input to those gates will be skipped. For the purposes of this invention it is desired to skip the erase high voltage and distribution tightening cycles, as well as the erase verify, program verify, and final erase stages of the complete erase operation. Thus, it is desired that the outputs 504 of logic gates 506, 508, 510, 514, and 516 be high. This will cause state machine 20 to skip the desired operations.

Conversely, because of the use of inverter 520, when signal 502 goes high (indicating that the external pattern write mode has been entered), one input to AND gates 512 and 518 is low. Therefore, output signal 504 of AND gates 512 and 518 is low and the corresponding cycle or stage (in this case the pre-programming cycle and pre-programming verify stage) are not skipped and instead are implemented. With the arrangement of logic gates shown in FIG. 8, when flow control register signal 502 goes high, the outputs 504 of logic gates 500 will cause state machine 20 to implement the pre-programming cycle and pre-programming verify stage and skip the other cycles and stages of the complete erase operation. The use of logic gates 500 and inverter 520 allows automatic control of the cycles and stages of the complete erase operation which are implemented when the external pattern write mode is entered.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A flash memory comprising:
   an array of non-volatile memory cells;
   a controller operable to control execution of a memory erase operation which includes a plurality of memory erase sub-operations, the memory erase sub-operations comprise programming a first memory cell with data indicative of a logic value of zero, verifying the data programmed into the first memory cell, and performing an erase step on the memory cells; and
   means for altering execution of the memory erase operation during a test mode to bypass the erase step and programming the first memory cell using a test pattern input by a user.

2. The flash memory of claim 1, wherein the means for altering execution of the memory erase operation comprises:
   a test pattern data input circuit; and
   a test pattern determiner operable to generate a second test pattern.

3. The flash memory of claim 2, wherein the means for altering execution of the memory erase operation further comprises:
   a data inverter operable to invert the input test pattern data to generate the second test pattern data.

4. The flash memory of claim 2, wherein the means for altering execution of the memory erase operation further comprises:
   a data modifier operable to modify the input test pattern data based on an incremented address to generate the second test pattern.

5. The memory system of claim 1, wherein the controller bypasses the memory erase sub-operation in response to control parameters stored in a data storage element of the memory system.

6. The memory system of claim 1, further comprising:
   an indicator which indicates success or failure of writing the test pattern.

7. A method of testing memory cells in a memory device a controller operable to control execution of a memory erase operation which includes a plurality of memory erase sub-operations, the memory erase sub-operations comprise programming a first memory cell with data indicative of a logic value of zero, verifying the data programmed into the first memory cell, and performing an erase step on the memory cells, the method comprising:
   inputting user specified test pattern data; and
   modifying execution of the memory erase sub-operations during a test mode operation in response to a flow control circuit, so that the erase step is bypassed and the first memory cell is programmed with the input test pattern data is instead of logic value of zero.

8. The method of claim 7, further comprising:
   inverting the input test pattern data and programming a second memory cell using the inverted test pattern data.

9. The method of claim 7, further comprising:
   setting a bit in a status register indicating success or failure of the modified memory erase sub-operations.

10. A non-volatile flash memory device comprising:

an array of non-volatile memory cells;

a controller operable to perform an erase function on the non-volatile memory cells by executing a sequence of steps including a pre-program step of writing the non-volatile memory cells to a programmed state prior to executing an erase step;

a test mode detector circuit for detecting a high voltage applied to two external terminals and initiating a test mode operation;

flow control circuitry adapted to modify the sequence of steps of the controller during the test mode operation such that the erase step is not performed by the controller, and the pre-program step writes an externally provided test pattern to the non-volatile memory cells in place of the programmed state executed during the erase function; and a bit register for storing data indicating if the externally provided test pattern is successfully programmed during the test mode.

11. The non-volatile memory device of claim 10 wherein the flow control circuitry includes a flow register capable of storing data corresponding to the sequence of steps which can be performed by the controller.

12. The non-volatile memory device of claim 11 wherein the flow register is an eight bit register.

13. The non-volatile memory device of claim 10 further comprising:

a data pattern inverter circuit for inverting the externally provided test pattern such that the pre-program step writes either the externally provided test pattern or the inverted test pattern to the non-volatile memory cells in place of the programmed state executed during the erase function.

14. The non-volatile memory device of claim 10 wherein the two external terminals are used to receive external control signals during non-test mode operation.

15. A non-volatile flash memory device comprising:

an array of non-volatile memory cells;

a controller operable to perform an erase function on the non-volatile memory cells by executing a sequence of steps including a pre-program step of writing the non-volatile memory cells to a programmed state prior to executing an erase step;

a test mode detector circuit for detecting a high voltage applied to two external terminals and initiating a test mode operation;

flow control circuitry adapted to modify the sequence of steps of the controller during the test mode operation such that the erase step is not performed by the controller, and the pre-program step writes an externally provided test pattern to the non-volatile memory cells in place of the programmed state executed during the erase function;

a flow control register for storing data indicating a modified flow control operation for use by the flow control circuitry; and an input data latch for storing the externally provided test pattern.

16. The non-volatile flash memory device of claim 15 further comprising a data verifier for comparing data read from the array of non-volatile memory cells with data stored in the input data latch.

17. A method of testing a non-volatile memory device comprising the steps of:

initiating a test mode of operation by detecting an externally provided signal;

modifying a standard erase operation sequence during the test mode, such that a pre-program step and a pre-program verify step are performed, the modified standard erase operation sequence bypasses a normal erase step of the standard erase operation sequence;

receiving an externally supplied data test pattern and storing the externally supplied data test pattern in an input data latch;

performing the pre-program step using the externally supplied data test pattern; and indicating if an error is detected during the pre-program verify step.

18. The method of claim 17 wherein the externally supplied data test pattern is written to an entire memory array.

19. The method of claim 17 further comprising the steps of:

internally generating a second test pattern, such that the pre-program step alternately writes the externally supplied data test pattern and the second test pattern to memory cells of the non-volatile memory device.

20. The method of claim 17 wherein the error is indicated by setting a bit in a status register.

* * * * *